(12) United States Patent
Brocklesby et al.

(10) Patent No.: US 10,165,668 B2
(45) Date of Patent: Dec. 25, 2018

(54) HEAT EXCHANGER FOR AN INFORMATION HANDLING SYSTEM

(71) Applicant: DELL PRODUCTS, LP, Round Rock, TX (US)

(72) Inventors: Brandon J. Brocklesby, Pflugerville, TX (US); Yu-Lin Chen, Taipei (TW); Chun-Cheng Lin, Taipei (TW)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 15/434,852

(22) Filed: Feb. 16, 2017

(65) Prior Publication Data
US 2018/0235070 A1    Aug. 16, 2018

(51) Int. Cl.
    *H05K 1/02*     (2006.01)
    *G06F 1/20*     (2006.01)
    *H05K 7/20*     (2006.01)

(52) U.S. Cl.
    CPC .............. *H05K 1/0203* (2013.01); *G06F 1/20* (2013.01); *H05K 7/2039* (2013.01); *H05K 7/20336* (2013.01); *H05K 2201/066* (2013.01)

(58) Field of Classification Search
    CPC ............. H05K 1/0203; H05K 7/20336; H05K 7/2039; H05K 2201/066; G06F 1/20
    See application file for complete search history.

(56) References Cited

U.S. PATENT DOCUMENTS

| | | | |
|---|---|---|---|
| 6,882,532 B2 * | 4/2005 | Chen | ............... H01L 23/3672 165/104.33 |
| 6,958,914 B2 | 10/2005 | Hoss | |
| 7,256,993 B2 | 8/2007 | Cravens et al. | |
| 7,391,614 B2 | 6/2008 | Artman | |
| 8,851,711 B2 * | 10/2014 | Ladewig | ................... F21S 2/00 362/249.02 |
| 9,377,828 B2 | 6/2016 | Tunks et al. | |
| 2010/0319880 A1 * | 12/2010 | Yu | ..................... H01L 23/427 165/104.26 |
| 2014/0174699 A1 * | 6/2014 | Lin | ..................... F28D 15/0275 165/104.21 |

\* cited by examiner

*Primary Examiner* — Mukund G Patel
(74) *Attorney, Agent, or Firm* — Larson Newman, LLP

(57) ABSTRACT

A heat exchanger includes first, second, and third heat sinks, multiple heat pipes located within the heat sinks, and a first aluminum bar located within the heat sinks. The first aluminum bar extends from an outside edge of the first heat sink, through the first, second, and third heat sinks, and to an outside edge of the third heat sink.

9 Claims, 5 Drawing Sheets

HEAT EXCHANGER FOR AN INFORMATION HANDLING SYSTEM

FIELD OF THE DISCLOSURE

The present disclosure generally relates to information handling systems, and more particularly relates to a heat exchanger for an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A heat exchanger includes first, second, and third heat sinks, multiple heat pipes located within the heat sinks, and an aluminum bar located within the heat sinks. The aluminum bar extends from an outside edge of the first heat sink, through the first, second, and third heat sinks, and to an outside edge of the third heat sink.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
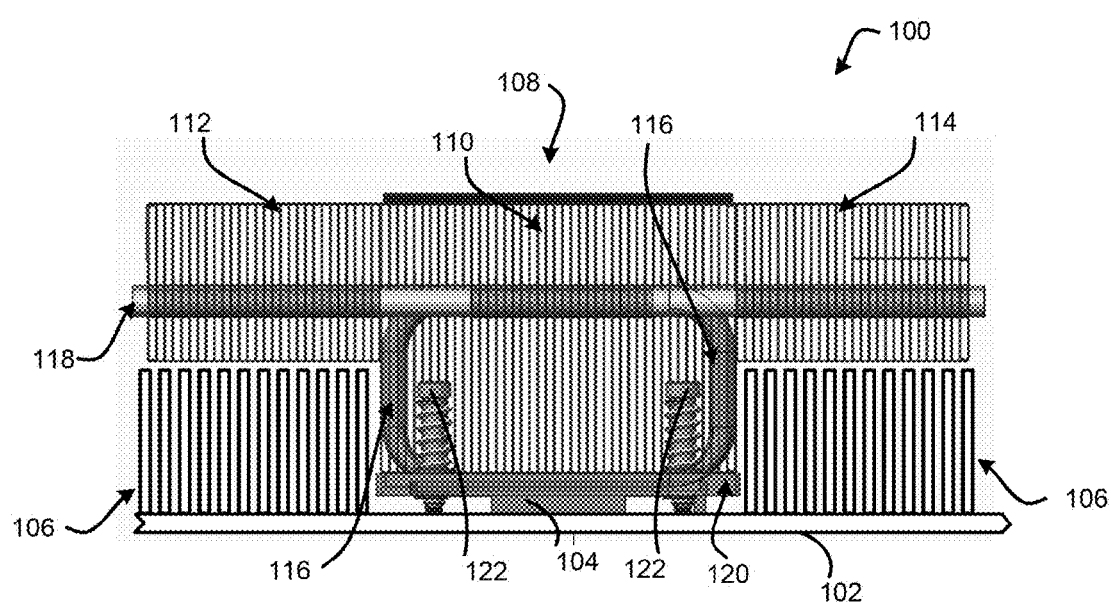
FIG. 1 is a diagram of a portion of an information handling system including a heat exchanger according to at least one embodiment of the present disclosure.

FIG. 1 illustrates an information handling systems 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

FIG. 1 illustrates a portion of an information handling system 100 including a circuit board 102, a central processing device 104, a plurality of peripheral component interconnect express (PCIe) devices 106, and a heat exchanger 108 according to at least one embodiment of the present disclosure. In an embodiment, the devices 106 can be dual in-line memory modules (DIMMs) instead of PCIe devices, can be a combination of bother PCIe devices and DIMMs, or any other similar devices. The heat exchanger 108 includes a multiple heat sinks 110, 112, and 114, multiple heat pipes 116, multiple aluminum bars 118, and a cold plate 120. In an embodiment, the heat sink 110 is a primary heat sink of the heat exchanger 108, and the heat sinks 112 and 114 are remote heat sinks of the heat exchanger 108. The heat exchanger 108 is mounted on top of the central processing device 104 and secured to the circuit board 102 via mounting screws 122. In an embodiment, the cold plate 120 can be a copper plate to transfer heat from the central processing device 104 into the heat exchanger 108.

A first portion of the heat pipes 116 extends from one side of the cold plate 120 to the other side, and then extends upward from that side of the cold plate 120. At a predetermined distance from a top of the cold plate 120 the first portion of heat pipes 116 bend ninety degrees and extend an outside edge of a heat sink at an opposite side of the heat exchanger 108. Similarly, a second portion of the heat pipes 116 extends from one side of the cold plate 120 to the other side, and then extends upward from that side of the cold plate 120 as the first portion of the heat pipes 116. At a pre-determined distance from a top of the cold plate 120 the second portion of heat pipes 116 bend ninety degrees and extend an outside edge of a heat sink at on the opposite side of the heat exchanger 108 as the first portion of heat pipes 116. The aluminum bars 118 extend from one side of the heat exchanger 108 to the other. For example, the aluminum bars 118 extend from an outside edge of the heat sink 112 through the heat sink 110, and to an outside edge of the heat sink 114.

During operation, the cold plate 120 can include a liquid that turns to steam when it is heated, which in turn removes heat from the central processing device 104. The heated stream then rises within the heat pipes 116, and transfers heat to the fins of the heat sinks 110, 112, and 114. Once the steam within the heat pipes 116 has cooled sufficiently, the steam turns back into liquid and flows back down the heat pipes 116 into the cold plate 120 to start the heat removal process again. However, as shown in FIG. 1, the information handling system 100 also includes multiple PCIe devices 106 that can also produce a large amount of heat. Thus, the heat sinks 112 and 114 located over the PCIe devices 106 should be able to be not only remove the heat produced by the central processing device 104, but also the heat produced by the PCIe devices 106. In this situation, the heat sinks 112 and 114 need to be large enough to dissipate this large amount of heat produced by the central processing device 104 and the PCIe devices 106.

However, if the heat sinks 112 and 114 are large enough to dissipate the necessary amount of heat, these heat sinks 112 and 114 may weigh more than if smaller amounts of heat were produced. For example, each of the heat sinks 112 and 114 may weigh 950 grams to dissipate the large amounts of heat produced by the central processing device 104 and the PCIe devices 106. This large amount of weight for the heat sinks 112 and 114 can put a strain on the heat exchanger 108, which in turn this strain can be transferred to the central processing device 104. In an embodiment, the information handling system 100 may experience shock and vibrations, which may cause additional strain on the heat exchanger 108 and the central processing device 104. Therefore, the aluminum bars 118 can be inserted through the heat sinks 110, 112, and 114, and then soldered to the heat sinks 110, 112, and 114 to provide additional support to the heat sinks 112 and 114. In an embodiment, the aluminum bars 118 can be more rigid than the heat pipes 116, such that the aluminum bars 118 can provide the necessary support to the heat sinks 112 and 114. In an embodiment, a cross section of the aluminum bars 118 can be aligned with the cross section of the heat pipes 118 within the heat sinks 110, 112, and 114, so that the thermal characteristics of the heat exchanger 108 is not changed by the aluminum bars 118.

Figure 2:
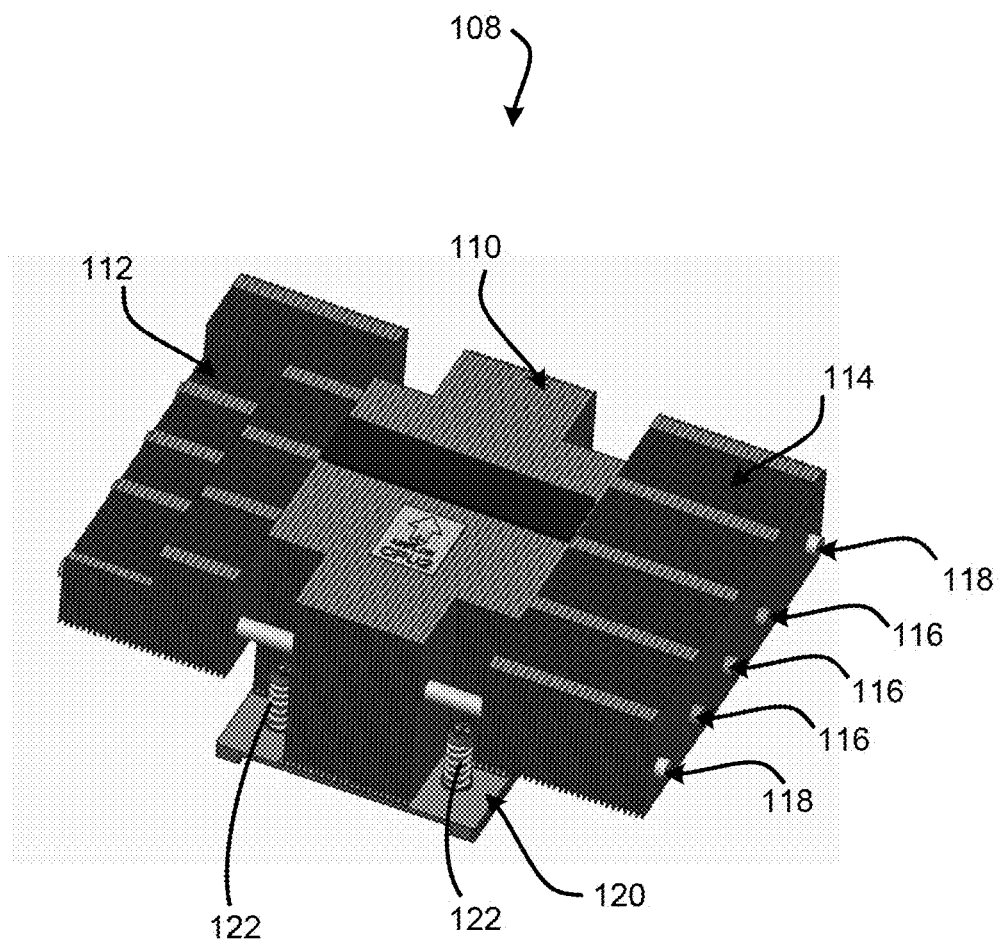
FIG. 2 is a perspective view of the heat exchanger according to at least one embodiment of the present disclosure.
Figure 3:
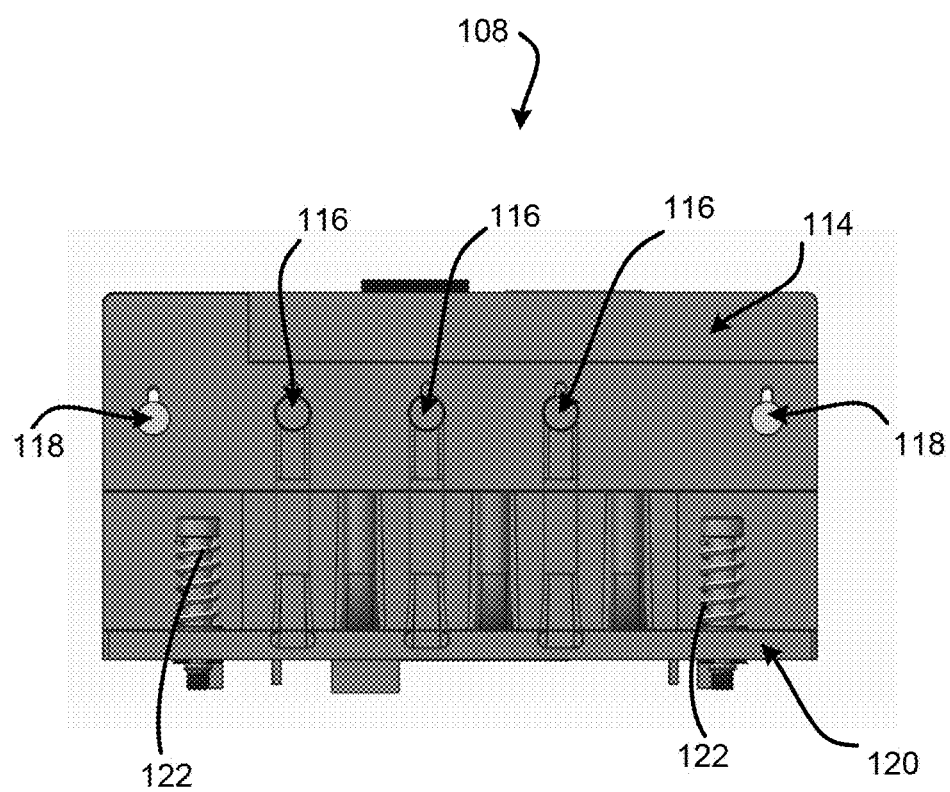
FIG. 3 is a side view of the heat exchanger according to at least one embodiment of the present disclosure.

FIG. 2 illustrates a perspective view of the heat exchanger 108 according to at least one embodiment of the present disclosure. FIG. 3 illustrates a side view of the heat exchanger 108 according to at least one embodiment of the present disclosure. The heat exchanger 108 includes the heat sinks 110, 112, and 114, the heat pipes 116, the aluminum bars 118, and the cold plate 120.

As shown in FIGS. 2 and 3, the aluminum bars 118 are aligned with the heat pipes 116 within the heat sinks 110, 112, and 114. As stated above with respect to FIG. 1, the alignment of the aluminum bars 118 with the heat pipes 116 does not impact the thermal characteristics of the heat exchanger 108. In an embodiment, the aluminum bars 118 are positioned within the heat sinks 110, 112, and 114 so that an individual can reach the mounting screws 122 with a screw driver or other tool while the aluminum bars 118 are still located within the heat sinks 110, 112, and 114. In this situation, the heat exchanger 108 can be built with the aluminum bars 118 and then attached to the circuit board 102 via the mounting screws 122 without the aluminum bars 118 affected the installation process. In an embodiment, the aluminum bars 118 do not affect the volume of the heat sinks 110, 112, and 114 based on holes being drilled within the heat sinks 110, 112, and 114 and the aluminum bars 118 being inserted within the holes.

Figure 4:
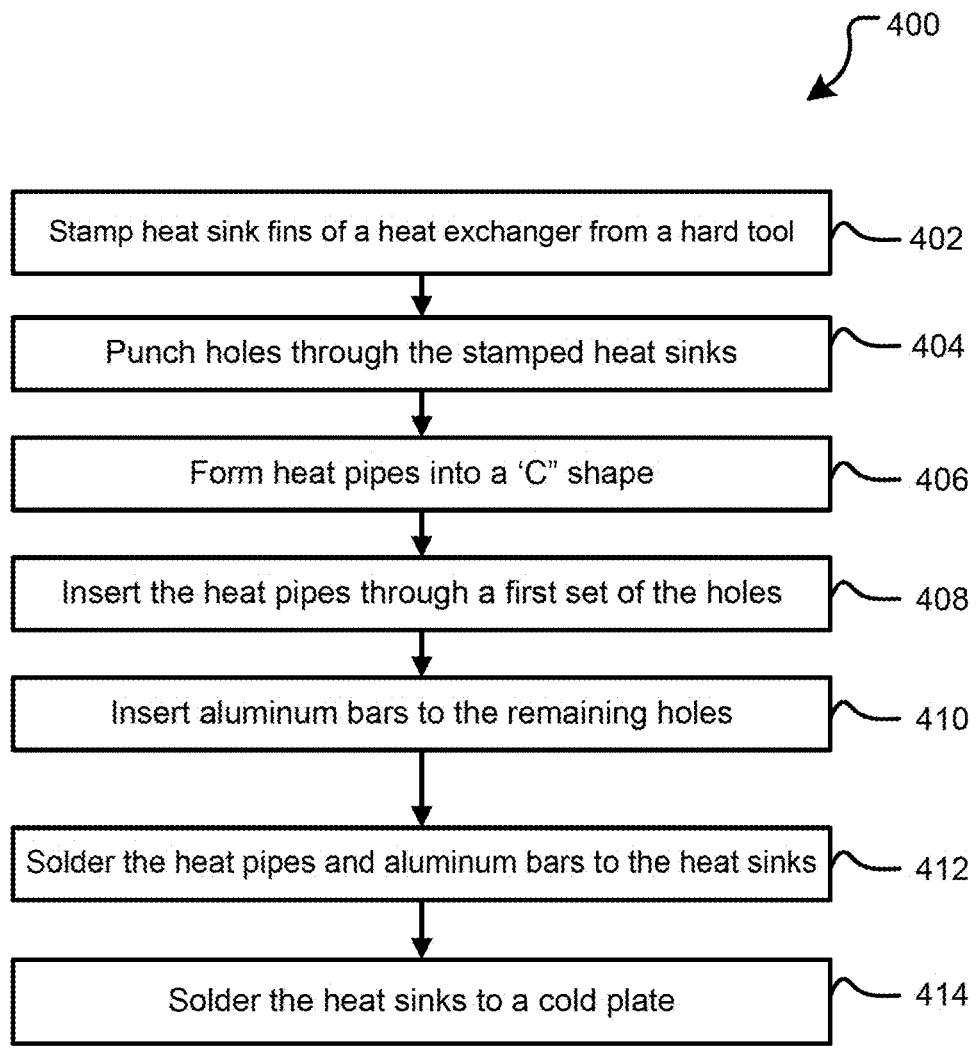
FIG. 4 is a flow diagram of a method for producing a highly capable air cooling heat exchanger according to at least one embodiment of the present disclosure.

FIG. 4 shows a method 400 for producing a highly capable air cooling heat exchanger according to at least one embodiment of the present disclosure. At block 402, heat sink fins of a heat exchanger are stamped from a hard tool. In an embodiment, the heat sink fins can be for first, second, and third heat sinks of the heat exchanger. In an embodiment, the heat sink fins can be made from copper. Holes are punched through the stamped heat sink fins at block 404. In an embodiment, the punched holes are for heat pipes and aluminum bars to be inserted within the heat sinks.

At block 406, heat pipes are formed into a "C" shape. The heat pipes are inserted through a first set of punched holes of the heat sink fins at block 408. At block 410, aluminum bars are slid through remaining holes in the heat sinks. The heat pipes and aluminum bars are soldered to the heat sinks at block 412. At block 414, the heat sinks are soldered to a cold plate. In an embodiment, the cold plate can be a copper base.

Figure 5:
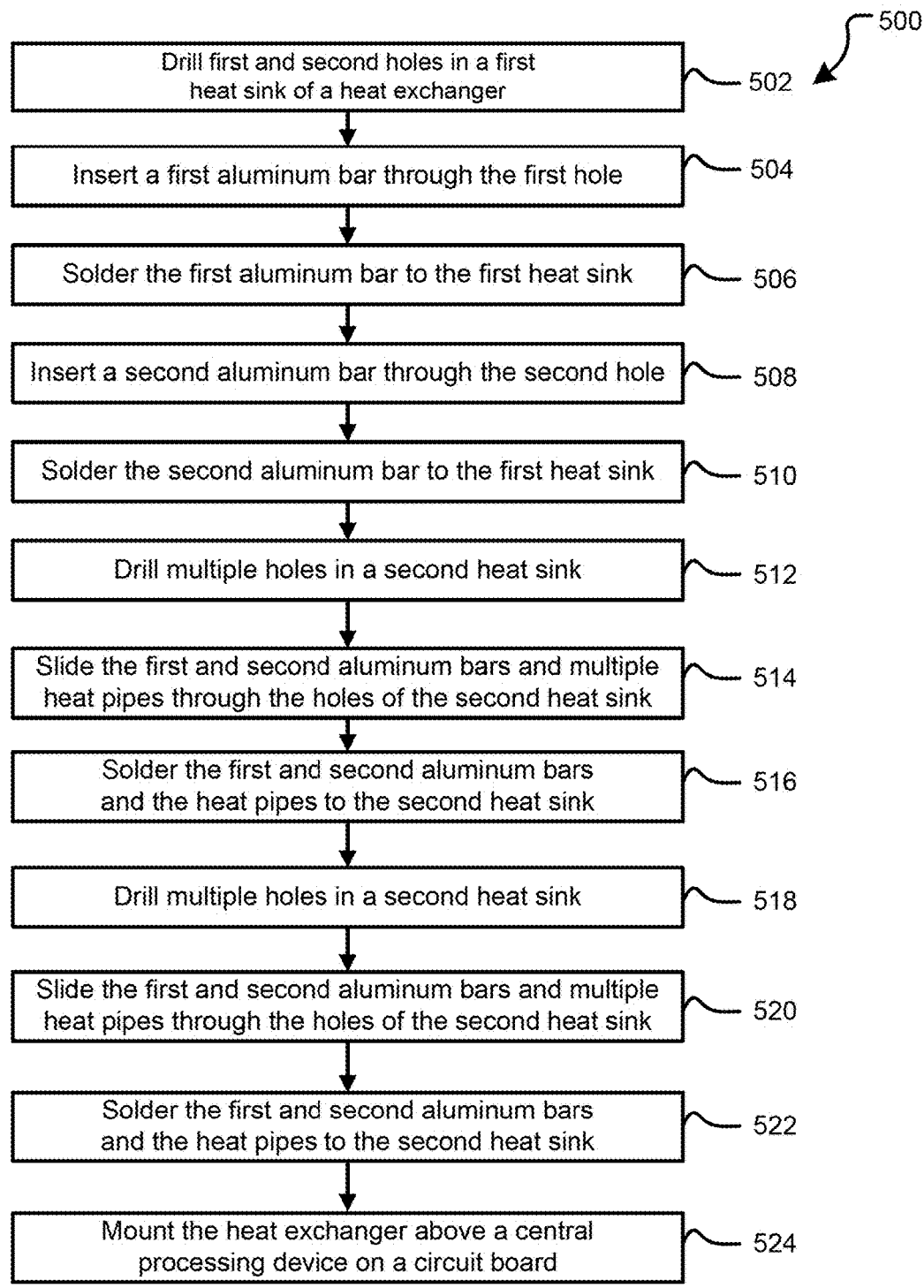
FIG. 5 is a flow diagram of another method for producing a highly capable air cooling heat exchanger according to at least one embodiment of the present disclosure.

FIG. 5 shows a method 500 for producing a highly capable air cooling heat exchanger according to at least one embodiment of the present disclosure. At block 502, first and second holes are drill in a first heat sink of a heat exchanger. In an embodiment, the heat exchanger can include multiple heat pipes that extend from the first heat sink. In an embodiment, the first and second holes can be located outside of the heat pipes and on opposite edges of the first heat sink. At block 504, a first aluminum bar is inserted through the first hole of the first heat sink. The first aluminum bar is soldered to the first heat sink at block 506.

At block 508, a second aluminum bar is inserted through the second hole of the first heat sink. The second aluminum bar is soldered to the first heat sink at block 510. At block 512, multiple holes are drilled in a second heat sink. The first and second aluminum bars and multiple heat pipes of the heat exchanger are slid through the holes of the second heat sink at block 514. At block 516, the first and second aluminum bars and multiple heat pipes are soldered to the second heat sink.

At block 518, multiple holes are drilled in a third heat sink. The first and second aluminum bars and multiple heat pipes of the heat exchanger are slid through the holes of the second heat sink at block 520. At block 522, the first and second aluminum bars and multiple heat pipes are soldered to the second heat sink. The heat exchanger is mounted above a central processing device on a circuit board at block 524.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A heat exchanger comprising:
   first, second, and third heat sinks;
   a plurality of heat pipes located within the heat sinks;
   a first aluminum bar located within a first hole through the heat sinks, wherein the first aluminum bar extends from an outside edge of the first heat sink, through the first, second, and third heat sinks, and to an outside edge of the third heat sink, wherein the first aluminum bar supports the weight of the first and third heat sinks; and
   a cold plate connected to the second heat sink, wherein a first portion of the heat pipes extends from a first side of the cold plate to a second side of the cold plate, extends upward from the second side of the cold plate and extends to an outside edge of the first heat sink at an opposite side of the heat exchanger as the second side of the cold plate;
   wherein a second portion of the heat pipes extends from the second side of the cold plate to the first side of the cold plate, extends upward from first side of the cold plate and extends to an outside edge of the third heat sink at an opposite side of the heat exchanger as the first side of the cold plate.

2. The heat exchanger of claim 1 further comprising:
   a second aluminum bar located within a second hole through the heat sinks, wherein the second aluminum bar extends from the outside edge of the first heat sink, through the first, second, and third heat sinks, and to the outside edge of the third heat sink, the second aluminum bar being soldered to the first and third heat sinks.

3. The heat exchanger of claim 1 wherein the first and third heat sinks extend from opposite edges of the second heat sink.

4. The heat exchanger of claim 3 the first, second, and third heat sinks to remove heat from a processing device, and multiple compute devices.

5. An information handling system comprising:
   a circuit board;
   a processing device mounted on the circuit board;
   a plurality of compute devices mounted on the circuit board;
   a heat exchanger including:
   first, second, and third heat sinks;

a plurality of heat pipes located within the beat sinks;
a first aluminum bar located within a first hole through the heat sinks, wherein the first aluminum bar extends from an outside edge of the first heat sink, through the first, second, and third heat sinks, and to an outside edge of the third heat sink, wherein the first aluminum bar supports the weight of the first and third heat sinks; and
a cold plate connected to the second heat sink, wherein a first portion of the heat pipes extends from a first side of the cold plate to a second side of the cold plate, extends upward from the second side of the cold plate and extends to an outside edge of the first heat sink at an opposite side of the heat exchanger as the second side of the cold plate;
wherein a second portion of the heat pipes extends from the second side of the cold plate to the first side of the cold plate, extends upward from first side of the cold plate and extends to an outside edge of the third heat sink at an opposite side of the heat exchanger as the first side of the cold plate.

6. The information handling system of claim 5 the heat exchanger further comprises:
a second aluminum bar located within a second hole through the heat sinks, wherein the second aluminum bar extends from the outside edge of the first heat sink, through the first, second, and third heat sinks, and to the outside edge of the third heat sink, the second aluminum bar being soldered to the first and third heat sinks.

7. The information handling system of claim 5 further comprising:
a plurality of mounting screws, the mounting screws to securely attached the heat exchanger above the processing device and to the circuit board.

8. The information handling system of claim 5 wherein the first and third heat sinks extend from opposite edges of the second heat sink.

9. The information handling system of claim 5 wherein the first and third heat sinks extend over the compute devices.

* * * * *